US012684880B2

(12) United States Patent
Chen et al.

(10) Patent No.: US 12,684,880 B2
(45) Date of Patent: Jul. 14, 2026

(54) IMAGE SENSOR WITH AUXILIARY PHOTOSENSITIVE REGION

(71) Applicant: ENKRIS SEMICONDUCTOR, INC., Suzhou (CN)

(72) Inventors: Yuchao Chen, Suzhou (CN); Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 659 days.

(21) Appl. No.: 18/156,989

(22) Filed: Jan. 19, 2023

(65) Prior Publication Data

US 2024/0072077 A1 Feb. 29, 2024

(30) Foreign Application Priority Data

Aug. 30, 2022 (CN) .......................... 202211049566.4

(51) Int. Cl.
*H10F 39/00* (2025.01)
*H10F 39/15* (2025.01)
*H10F 39/18* (2025.01)

(52) U.S. Cl.
CPC ....... *H10F 39/8027* (2025.01); *H10F 39/153* (2025.01); *H10F 39/182* (2025.01)

(58) Field of Classification Search
CPC ... H10F 39/8027; H10F 39/153; H10F 39/182
See application file for complete search history.

(56) References Cited

U.S. PATENT DOCUMENTS 7,132,724 B1 * 11/2006 Merrill ................ H10F 39/1825
                                                         438/70
2018/0309965 A1 * 10/2018 Ahmed .................. H04N 23/20
2022/0037386 A1 * 2/2022 Ikakura ............... H10F 39/8067

* cited by examiner

*Primary Examiner* — Aaron J Gray
(74) *Attorney, Agent, or Firm* — Westbridge IP LLC

(57) ABSTRACT

Disclosed is an image sensor, comprising: at least one photosensitive unit, where the photosensitive unit includes a main photosensitive region and an auxiliary photosensitive region arranged at the periphery of the main photosensitive region, and a photosensitive component content of the main photosensitive region is different from a photosensitive component content of the auxiliary photosensitive region. The disclosure enlarges a wavelength range of sensible light of each the photosensitive unit by arranging the auxiliary photosensitive region at the periphery of the main photosensitive region of the photosensitive unit, where the photosensitive component content of the main photosensitive region is different from that of the auxiliary photosensitive region. Thereby more image details may be recorded to generate images with high dynamic range, which enables people to experience a visual effect close to a real environment.

15 Claims, 8 Drawing Sheets

IMAGE SENSOR WITH AUXILIARY PHOTOSENSITIVE REGION

CROSS-REFERENCE TO RELATED APPLICATIONS

The application claims priority to Chinese Patent Application No. 202211049566.4, filed on Aug. 30, 2022, the entire contents of which are incorporated herein by reference.

TECHNICAL FIELD

The present disclosure relates to the technical field of image processing, and in particular, to an image sensor.

BACKGROUND

An image sensor is an important part of a camera device. In a shooting environment with a wide range of brightness, existing image sensors cannot generate an image with a high dynamic range and accordingly cannot provide more image details. As a result, the visual effect of a real environment cannot be restored. Therefore, how to improve the dynamic range of the image sensor is an urgent problem to be solved.

SUMMARY

In order to solve the above technical problems, the present disclosure is proposed. Embodiments of the present disclosure provide an image sensor.

An embodiment of the present disclosure provides an image sensor, including: at least one photosensitive unit, where the photosensitive unit includes a main photosensitive region and an auxiliary photosensitive region arranged at a periphery of the main photosensitive region, a photosensitive component content of the main photosensitive region is different from a photosensitive component content of the auxiliary photosensitive region, and the auxiliary photosensitive region is used for improving a dynamic range of the image sensor.

In some embodiments of the disclosure, the auxiliary photosensitive region includes at least one first auxiliary photosensitive region and at least one second auxiliary photosensitive region, and a photosensitive component content of the first auxiliary photosensitive region is different from a photosensitive component content of the second auxiliary photosensitive region.

In some embodiments of the disclosure, the photosensitive component content of the main photosensitive region is higher than the photosensitive component content of the first auxiliary photosensitive region, and is lower than the photosensitive component content of the second auxiliary photosensitive region.

In some embodiments of the disclosure, a plurality of the first auxiliary photosensitive regions and a plurality of the second auxiliary photosensitive regions are alternately arranged at the periphery of the main photosensitive region.

In some embodiments of the disclosure, a photosensitive component of the photosensitive unit includes an indium-containing GaN-based compound, and an indium component content of the main photosensitive region is different from an indium component content of the auxiliary photosensitive region.

In some embodiments of the disclosure, in the photosensitive unit, a difference between the indium component content of the main photosensitive region and the indium component content of the auxiliary photosensitive region is less than or equal to 4%.

In some embodiments of the disclosure, the image sensor further includes: a plurality of pixel groups, wherein each of the pixel groups includes at least three the photosensitive units, including a red photosensitive unit, a green photosensitive unit, and a blue photosensitive unit, and a photosensitive component content of a main photosensitive region of the red photosensitive unit, a photosensitive component content of a main photosensitive region of the green photosensitive unit, and a photosensitive component content of a main photosensitive region of the blue photosensitive unit are different.

In some embodiments of the disclosure, an area of the red photosensitive unit is larger than an area of the green photosensitive unit, and/or the area of the red photosensitive unit is larger than an area of the blue photosensitive unit.

In some embodiments of the disclosure, the pixel group further includes an infrared photosensitive unit, and a photosensitive component content of a main photosensitive region of the infrared photosensitive unit is higher than the photosensitive component content of the main photosensitive region of the red photosensitive unit.

In some embodiments of the disclosure, the image sensor further includes: a main charge storage part electrically connected to the main photosensitive region, and an auxiliary charge storage part electrically connected to the auxiliary photosensitive region, where the main charge storage part and the auxiliary charge storage part are electrically insulated from each other.

In some embodiments of the disclosure, the image sensor further includes: an isolation part arranged between the main photosensitive region and the auxiliary photosensitive region, where the isolation part includes a metal member and a transparent insulation layer arranged on an outer surface of the metal member, and the isolation part is used for electrically insulating the main photosensitive region from the auxiliary photosensitive region.

In some embodiments of the disclosure, the metal member includes a metal grid, used for reflecting light which obliquely projects to the photosensitive unit to the photosensitive unit again and isolating light between adjacent photosensitive units.

In some embodiments of the disclosure, the photosensitive unit further includes an electrode-wire connection region, used for arranging electrode wires to transfer charges.

In some embodiments of the disclosure, a photosensitive component of the photosensitive unit includes an aluminum-containing GaN-based compound, and an aluminum component content of the main photosensitive region is different from the aluminum component content of the auxiliary photosensitive region.

In some embodiments of the disclosure, a photosensitive material of the photosensitive unit includes indium gallium nitride.

In some embodiments of the disclosure, the photosensitive unit includes a single-quantum-well structure or a multiple-quantum-well structure arranged in layers.

The present disclosure provides an image sensor, including: at least one photosensitive unit, where the photosensitive unit includes a main photosensitive region and an auxiliary photosensitive region arranged at a periphery of the main photosensitive region, and a photosensitive component content of the main photosensitive region is different from a photosensitive component content of the auxiliary photosensitive region, and the auxiliary photosensitive region is used for improving a dynamic range of the image sensor. The disclosure enlarges a wavelength range of sensible light of each the photosensitive unit by arranging the auxiliary photosensitive region at the periphery of the main photosensitive region of the photosensitive unit, where the photosensitive component content of the main photosensitive region is different from that of the auxiliary photosensitive region. Thereby more image details may be recorded to generate an image with high dynamic range, which enables people to experience a visual effect close to a real environment.

BRIEF DESCRIPTION OF THE DRAWINGS

Through a more detailed description of the embodiments of the present disclosure with reference to the accompanying drawings, the above and other purposes, features and advantages of the present disclosure will become more obvious. The accompanying drawings are provided for further understanding of the present disclosure, and constitute a part of the specification. The accompanying drawings and the embodiments of the present disclosure are used to explain the present disclosure and do not constitute a limitation to the present disclosure. In the accompanying drawings, a same reference label is used for representing the same component or step.

DETAILED DESCRIPTION OF THE EMBODIMENTS

The technical solutions in the embodiments of the present disclosure will be clearly and completely described below with reference to the accompanying drawings in the embodiments of the present disclosure. Apparently, the described embodiments are only a part of the embodiments of the present disclosure, but not all of the embodiments. Based on the embodiments in the present disclosure, all other embodiments obtained by those skilled in the art without creative efforts shall fall within the protection scope of the present disclosure.

In addition, in order to better illustrate the present disclosure, numerous specific details are given in the following detailed description. It should be understood by those skilled in the art that the present disclosure may be practiced without certain specific details. In some instances, methods, means, components and circuits well known to those skilled in the art have not been described in detail so as not to obscure the subject matter of the present disclosure.

Figure 1:
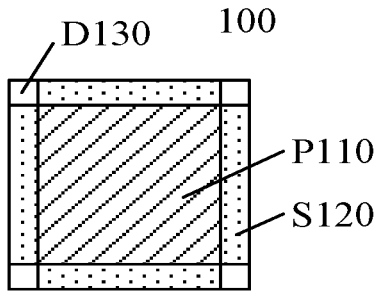
FIG. 1 is a structural schematic diagram of a photosensitive unit provided by an exemplary embodiment of the present disclosure.

FIG. 1 is a structural schematic diagram of a photosensitive unit provided by an exemplary embodiment of the present disclosure. As shown in FIG. 1, the image sensor provided by the embodiment of the present disclosure includes: at least one photosensitive unit 100, the photosensitive unit 100 including a main photosensitive region P110 and a plurality of auxiliary photosensitive regions S120 arranged at a periphery of the main photosensitive region P110. A photosensitive component content of the main photosensitive region P110 is different from a photosensitive component content of the auxiliary photosensitive region S120, and the auxiliary photosensitive region S120 is used for improving a dynamic range of the image sensor.

Specifically, as shown in FIG. 1, the photosensitive unit 100 includes the main photosensitive region P110 and four auxiliary photosensitive regions S120 arranged at the periphery of the main photosensitive region P110. The main photosensitive region P110 is arranged at the center of the photosensitive unit 100, and a shape of the main photosensitive region P110 is a square. The four auxiliary photosensitive regions S120 are respectively arranged at the periphery of the four sides of the main photosensitive region P110, and a shape of the auxiliary photosensitive region S120 is a rectangle. Optionally, the shape of the main photosensitive region P110 and the auxiliary photosensitive regions S120 are not specifically limited in this embodiment.

Specifically, the photosensitive component content of the main photosensitive region P110 is different from the photosensitive component content of the auxiliary photosensitive region S120, so that a wavelength range of sensible light corresponding to the main photosensitive region P110 is different from a wavelength range of sensible light corresponding to the auxiliary photosensitive region S120. The wavelength range of sensible light corresponding to the auxiliary photosensitive region S120 covers a wavelength range not covered by the wavelength range of sensible light corresponding to the main photosensitive region P110. Therefore, an uncovered wavelength range of sensible light may be added to the wavelength range of sensible light corresponding to the main photosensitive region P110, the wavelength range of sensible light of each the photosensitive unit 100 is enlarged and accordingly a dynamic range of the image sensor is enlarged. And then more image details may be recorded, so that an image with a high dynamic range may be generated and people may experience a visual effect close to the real environment.

In an embodiment of the present disclosure, a photosensitive component of the photosensitive unit 100 includes an indium-containing GaN-based compound, and an indium component content of the main photosensitive region P110 is different from an indium component content of the auxiliary photosensitive region S120. Exemplarily, the indium component content refers to the percentage of the amount of substance of the indium element to the sum of the amount of substance of all positively charged elements. Specifically, by adjusting the indium component content of the main photosensitive region P110 and the indium component content of the auxiliary photosensitive region S120 to be different, the main photosensitive region P110 and the auxiliary photosensitive region S120 may respectively sense light with different wavelength ranges, so as to enlarge the dynamic range of the image sensor and generate an image with a high dynamic range.

In an embodiment of the present disclosure, for a photosensitive unit 100, a difference between the indium component content of the main photosensitive region P110 and the indium component content of the auxiliary photosensitive region S120 is less than or equal to 4%. Exemplarily, the indium component content of the main photosensitive region P110 is higher than that of the auxiliary photosensitive region S120 (the difference in content is not more than 4%), or the indium component content of the main photosensitive region P110 is lower than that of the auxiliary photosensitive region S120 (the content difference does not exceed 4%). The indium component content of the main photosensitive region P110 is different from that of the auxiliary photosensitive region S120, so that the wavelength range of sensible light of the photosensitive unit 100 is appropriately enlarged.

In an embodiment of the present disclosure, a photosensitive component of the photosensitive unit 100 includes an aluminum-containing GaN-based compound, and an aluminum component content of the main photosensitive region P110 is different from an aluminum component content of the auxiliary photosensitive region S120. Exemplarily, the aluminum component content refers to the percentage of the amount of substance of the aluminum element to the sum of the amount of substances of all positively charged elements. Specifically, by adjusting the aluminum component content of the main photosensitive region P110 and the aluminum component content of the auxiliary photosensitive region S120 to be different, the main photosensitive region P110 and the auxiliary photosensitive region S120 may respectively sense ultraviolet light with different wavelength ranges, a wavelength range of sensible light of the ultraviolet sensor may be enlarged, and accordingly sensitivity of the sensor to a wider wavelength range of ultraviolet light may be improved.

In an embodiment of the present disclosure, as shown in FIG. 1, the photosensitive unit 100 further includes an electrode-wire connection region D130, used for arranging electrode wires which are capable of transferring charges, thereby the charges generated by the photosensitive unit 100 may be transferred. Optionally, the electrode-wire connection region D130 may be arranged at one end of the auxiliary photosensitive unit S120. Optionally, the electrode-wire connection region D130 may be arranged at a blank area formed by the main and auxiliary photosensitive units in the photosensitive unit 100. Specifically, as shown in FIG. 1, the electrode-wire connection region D130 is arranged at four corners of the periphery of the main photosensitive region P110 which are formed by the four auxiliary photosensitive regions S120 with a shape of a rectangle, and the shape of the electrode-wire connection region D130 may be a square or a rectangle, which is not further limited in this embodiment of the present disclosure.

Figure 2:
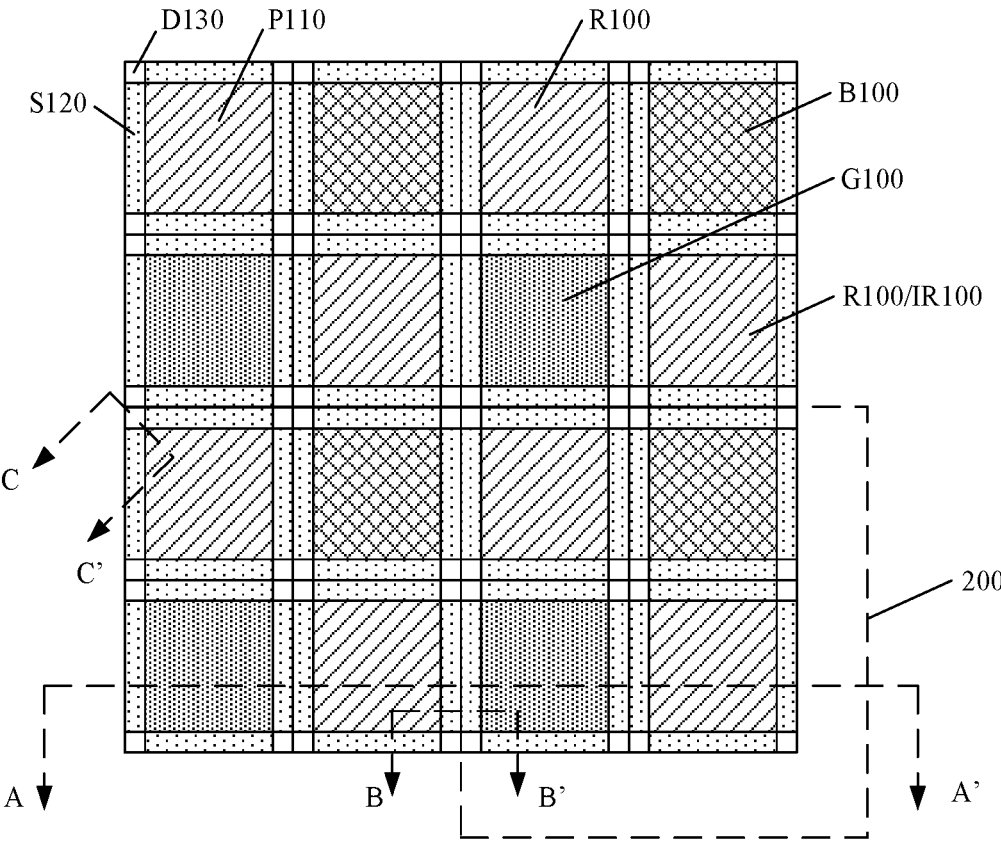
FIG. 2 is a structural schematic diagram of an image sensor provided by an exemplary embodiment of the present disclosure.

FIG. 2 is a structural schematic diagram of an image sensor provided by an exemplary embodiment of the present disclosure. The embodiment shown in FIG. 2 of the present disclosure is extended on the basis of the embodiment shown in FIG. 1 of the present disclosure. The following focuses on the differences between the embodiment shown in FIG. 2 and the embodiment shown in FIG. 1, and the similarities will not be repeated.

As shown in FIG. 2, the image sensor provided by this embodiment of the present disclosure includes: four pixel groups 200, each the pixel group 200 including four photosensitive units 100 and the four photosensitive units 100 including two red photosensitive units R100 and a green photosensitive unit G100, and a blue photosensitive unit B100 with the two red photosensitive units R100 arranged at diagonal positions of the pixel group 200.

In an embodiment of the present disclosure, the photosensitive component content of the main photosensitive region P110 of the red photosensitive unit R100, the photosensitive component content of the main photosensitive region P110 of the green photosensitive unit G100, and the photosensitive component content of the main photosensitive region P110 of the blue photosensitive unit B100 are different. Exemplarily, the indium component content of the main photosensitive region P110 of the red photosensitive unit R100, the indium component content of the main photosensitive region P110 of the green photosensitive unit G100, and the indium component content of the main photosensitive region P110 of the blue photosensitive unit B100 are in a descending order. Specifically, the indium component contents are different, and the wavelengths of the sensible light are different. Photosensitive units 100 capable of sensing three colors of red, green and blue are provided in one pixel group 200, so that the entire visible light spectrum may be covered. When the image sensor senses external light, it can directly record color images with wavelength ranges of all visible light in the environment. The main photosensitive region and the auxiliary photosensitive regions are arranged in combination to generate a high dynamic range image, so that people may experience the visual effect close to the real environment.

It should be noted that, for example, the red photosensitive unit R100 includes a main photosensitive region P110 and an auxiliary photosensitive region S120 both of which are sensitive to red light; and it's the same for the green photosensitive unit G100 and the blue photosensitive unit B100.

Optionally, an indium component content of the main photosensitive region P110 of the red photosensitive unit R100 is 0.4 to 0.6, an indium component content of the main photosensitive region P110 of the green photosensitive unit G100 is 0.2 to 0.3, and an indium component content of the main photosensitive region P110 of the blue photosensitive unit B100 is 0.01 to 0.1.

It should be noted that, as shown in FIG. 2, the auxiliary photosensitive region S120 corresponding to the red photosensitive unit R100 and the auxiliary photosensitive region S120 corresponding to the green photosensitive unit G100 have the same filling pattern, which only means that the corresponding structures are auxiliary photosensitive regions, not the contents of the photosensitive components in above two auxiliary photosensitive regions are the same.

In an embodiment of the present disclosure, the area of the red photosensitive unit R100 is larger than the area of the green photosensitive unit G100, and/or the area of the red photosensitive unit R100 is larger than the area of the blue photosensitive unit B100. Specifically, as shown in FIG. 2, each pixel group 200 includes four photosensitive units 100 of the same area, and each the pixel group 200 includes two red photosensitive units R100, a green photosensitive unit G100 and a blue photosensitive unit B100. Therefore, in each the pixel group 200, the area of the red photosensitive unit R100 is twice that of the green photosensitive unit G100, and the area of the red photosensitive unit R100 is also twice the area of the blue photosensitive unit B100. The reason why the area of the red photosensitive unit R100 is larger than the area of the green photosensitive unit G100, and/or the area of the red photosensitive unit R100 is larger than that of the blue photosensitive unit B100 is because the quality of the epitaxial crystal of the red photosensitive unit R100 of high indium component content is relatively poor in its preparation process, resulting in that the photosensitive efficiency of the red photosensitive unit is lower than that of the green photosensitive unit G100, and also lower than the photosensitive efficiency of the blue photosensitive unit B100. Optionally, the indium component content in each of the four auxiliary photosensitive regions S120 of each the photosensitive unit 100 shown in FIG. 2 are the same.

In an embodiment of the present disclosure, the image sensor includes a sensing stage and an image display stage. In the sensing stage, the red photosensitive unit, the green photosensitive unit, and the blue photosensitive unit sense red light, green light, and blue light, respectively, so that light sensing in a visible light range may be realized. In the image display stage, the red photosensitive unit, the green photosensitive unit and the blue photosensitive unit emit red light, green light and blue light respectively to realize the display function.

Optionally, the image sensor includes a sensing region and a display region, the sensing region includes a red photosensitive unit, a green photosensitive unit, and a blue photosensitive unit to realize light sensing; the display region includes a red light-emitting unit, a green light-emitting unit, and a blue light-emitting unit to realize display function. Optionally, taking the red photosensitive unit, the green photosensitive unit and the blue photosensitive unit as a whole, and taking the red light-emitting unit, the green light-emitting unit and the blue light-emitting unit as a whole, the sensing region and the display region are arranged in a horizontal direction or in a vertical direction or alternately in both horizontal and vertical directions. Optionally, each photosensitive unit in the sensing area and each light-emitting unit in the display area are arranged in a horizontal direction or in a vertical direction or alternately in both horizontal and vertical directions.

In an embodiment of the present disclosure, as shown in FIG. 2, the pixel group 200 further includes an infrared photosensitive unit IR200, and the photosensitive component content in the main photosensitive region P110 of the infrared photosensitive unit IR200 is higher than the photosensitive component content of the main photosensitive region P110 of the red photosensitive unit R200, for example, the indium component content of the main photosensitive region P110 of the infrared photosensitive unit IR200 is 0.7 to 0.9. With four photosensitive units of infrared, red, green and blue being provided in a pixel group 200 at the same time, the integration is higher, and a light sensing function in a range from infrared to visible light may be realized.

Figure 3:
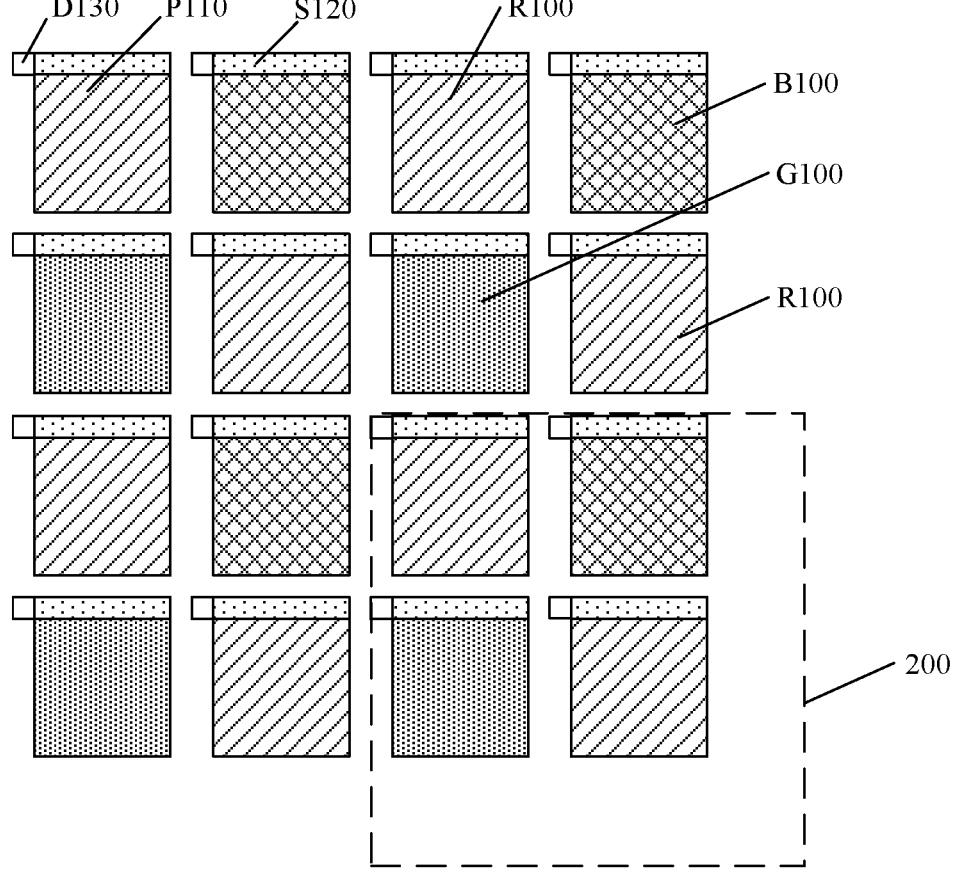
FIG. 3 is a structural schematic diagram of an image sensor according to another exemplary embodiment of the present disclosure.

FIG. 3 is a structural schematic diagram of an image sensor according to another exemplary embodiment of the present disclosure. The embodiment shown in FIG. 3 of the present disclosure is extended on the basis of the embodiment shown in FIG. 2 of the present disclosure. The following focuses on the differences between the embodiment shown in FIG. 3 and the embodiment shown in FIG. 2, and the similarities will not be repeated.

As shown in FIG. 3, the photosensitive unit 100 provided by the embodiment of the present disclosure includes a main photosensitive region P110 and an auxiliary photosensitive region S120 arranged at the periphery of one edge of the main photosensitive region P110.

In an embodiment of the present disclosure, in one photosensitive unit 100, the indium component content of the main photosensitive region P110 is larger than that of the auxiliary photosensitive region S120 (the difference in content is not more than 4%), or the indium component content of the main photosensitive region P110 is smaller than that of the auxiliary photosensitive region S120 (the difference in content does not exceed 4%). The indium component content of the main photosensitive region P110 is different from that of the auxiliary photosensitive region S120, so that the wavelength range of the sensible light of the photosensitive unit 100 is appropriately enlarged.

Figure 4:
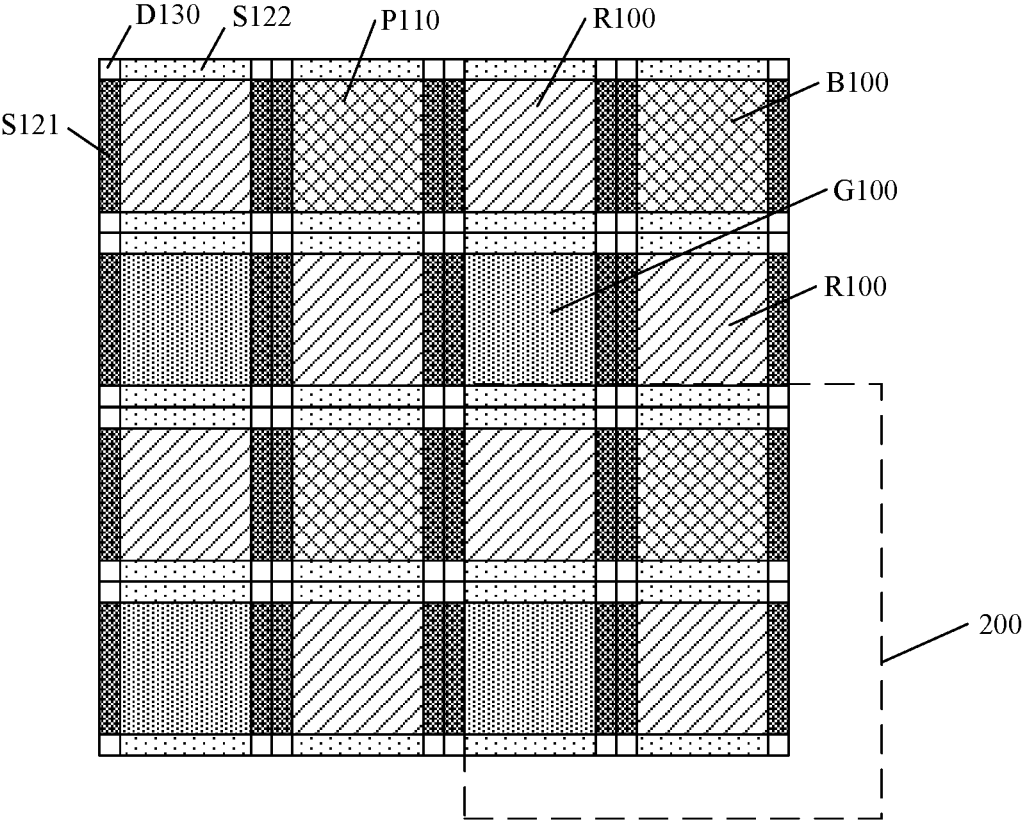
FIG. 4 is a structural schematic diagram of an image sensor according to still another exemplary embodiment of the present disclosure.

FIG. 4 is a structural schematic diagram of an image sensor according to still another exemplary embodiment of the present disclosure. The embodiment shown in FIG. 4 of the present disclosure is extended on the basis of the embodiment shown in FIG. 2 of the present disclosure. The following focuses on the differences between the embodiment shown in FIG. 4 and the embodiment shown in FIG. 2, and the similarities will not be repeated.

As shown in FIG. 4, in each photosensitive unit 100 provided in this embodiment of the present disclosure, the auxiliary photosensitive region S120 includes at least a first auxiliary photosensitive region S121 and at least a second auxiliary photosensitive region S122. The photosensitive component content of the first auxiliary photosensitive region S121 and the photosensitive component content of the second auxiliary photosensitive region S122 are different. It should be noted that, by arranging two auxiliary photosensitive regions (first auxiliary photosensitive region S121 and the second auxiliary photosensitive region S122) with different photosensitive component content at the periphery of the main photosensitive region P110 in one photosensitive unit 100, the wavelength range of the sensible light of the photosensitive unit 100 may be further enlarged, and dynamic range of the image sensor may be improved as well.

In an embodiment of the present disclosure, as shown in FIG. 4, a plurality of the first auxiliary photosensitive regions S121 and a plurality of the second auxiliary photosensitive regions S122 are alternately arranged at the periphery of the main photosensitive region P110. As shown in FIG. 4, in each photosensitive unit 100, the auxiliary photosensitive region S120 includes two first auxiliary photosensitive regions S121 and two second auxiliary photosensitive regions S122, and the first auxiliary photosensitive regions S121 and the second auxiliary photosensitive regions S122 are alternately arranged at the periphery of the main photosensitive region P110, and the auxiliary photosensitive regions with different photosensitive component content are scattered to sense ambient light more uniformly. Specifically, the first auxiliary photosensitive regions S121 are arranged at the periphery of two opposite sides of the main photosensitive region P110, and the second auxiliary photosensitive regions S122 are arranged at the periphery of the other two opposite sides of the main photosensitive region P110.

In an embodiment of the present disclosure, the photosensitive component content of the main photosensitive region P110 is higher than the photosensitive component content of the first auxiliary photosensitive region S121 and lower than the photosensitive component content of the second auxiliary photosensitive region S122. In one photosensitive unit 100, at least two auxiliary photosensitive regions S120 are arranged at the periphery of the main photosensitive region P110, among which one has wavelength range of sensible light larger than that of the main photosensitive region P110 and another one has wavelength range of sensible light smaller than that of the main photosensitive region P110, so as to improve the dynamic range of the image sensor.

Specifically, for example, when the indium component content of the main photosensitive region P110 of the red photosensitive unit R100 is 0.5, the indium component content of the first auxiliary photosensitive region S121 of the red photosensitive unit R100 is 0.46, and the indium component content of the auxiliary photosensitive region S122 of the red photosensitive unit R100 is 0.54. For example, when the indium component content of the main photosensitive region P110 of the green photosensitive unit G100 is 0.25, the indium component content of the first auxiliary photosensitive region S121 of the green photosensitive unit G100 is 0.21, and the indium component content of the second auxiliary photosensitive region S122 of the green photosensitive unit G100 is 0.29. For example, when the indium component content of the main photosensitive region P110 of the blue photosensitive unit B100 is 0.05, the indium component content of the first auxiliary photosensitive region S121 of the blue photosensitive unit B100 is 0.01, and the indium component content of the second auxiliary photosensitive region S122 of the blue photosensitive unit B100 is 0.09.

Figure 5:
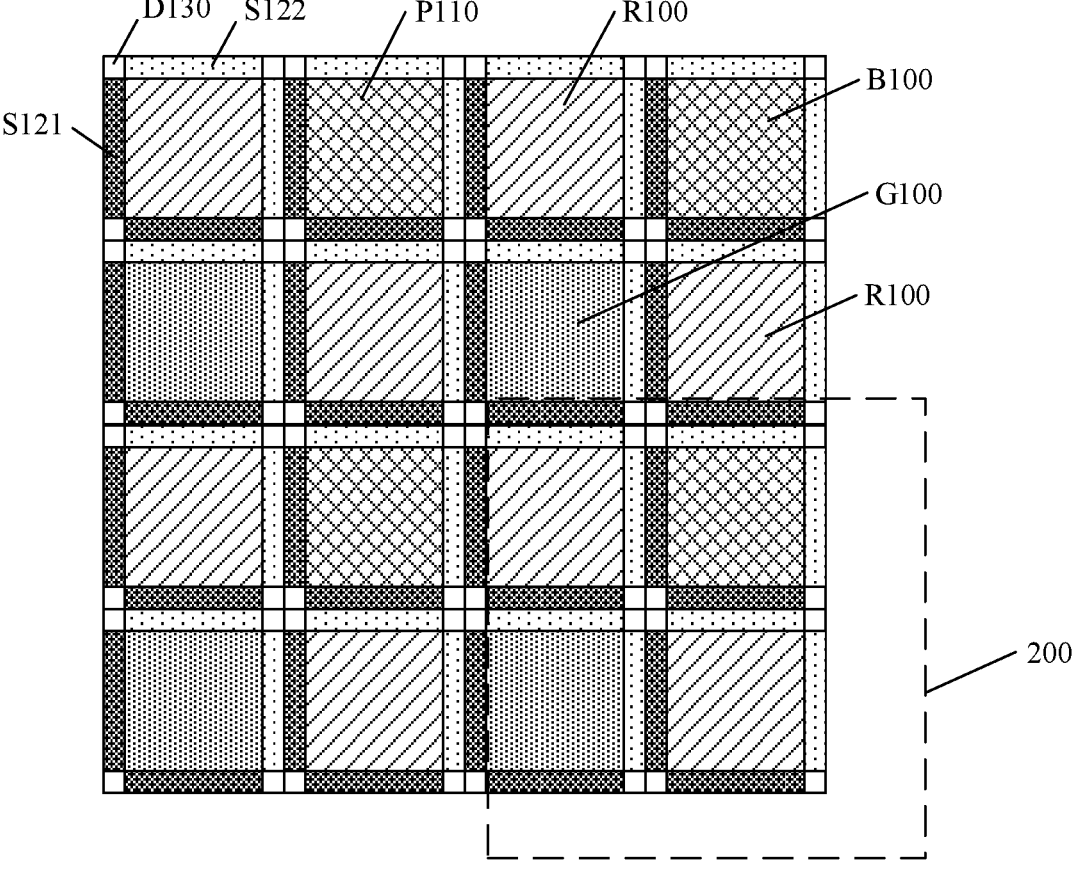
FIG. 5 is a structural schematic diagram of an image sensor according to yet still another exemplary embodiment of the present disclosure.

Optionally, FIG. 5 is a structural schematic diagram of an image sensor provided by yet still another exemplary embodiment of the present disclosure. As shown in FIG. 5, in each photosensitive unit 100 provided in the embodiment of the present disclosure, the auxiliary photosensitive region S120 includes two first auxiliary photosensitive regions S121 and two second auxiliary photosensitive regions S122. The first auxiliary photosensitive regions S121 are arranged at the periphery of two adjacent sides of the main photosensitive region P110, and the second auxiliary photosensitive regions S122 are arranged at the periphery of the two adjacent sides of the main photosensitive region P110.

Figure 6:
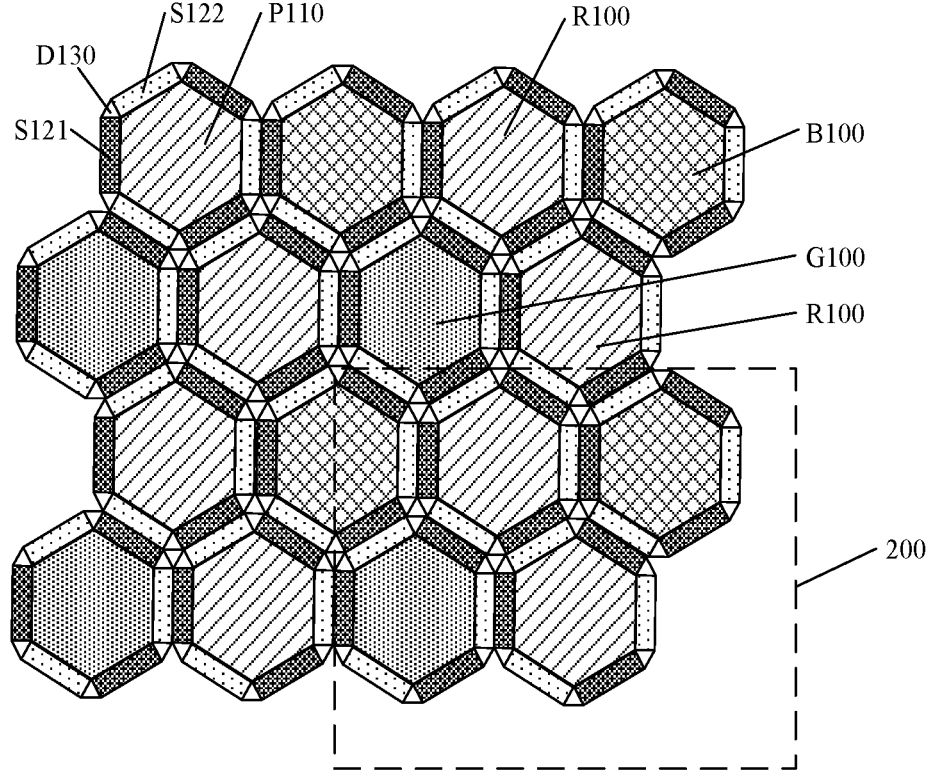
FIG. 6 is a structural schematic diagram of an image sensor according to yet still another exemplary embodiment of the present disclosure.

Optionally, FIG. 6 is a structural schematic diagram of an image sensor provided by yet still another exemplary embodiment of the present disclosure. As shown in FIG. 6, in each photosensitive unit 100 provided in this embodiment of the present disclosure, the shape of the main photosensitive region P110 is a regular hexagon. The auxiliary photosensitive region S120 includes three first auxiliary photosensitive regions S121 and three second auxiliary photosensitive regions S122. The three first auxiliary photosensitive regions S121 and the three second auxiliary photosensitive regions S122 are provided at the periphery of the six sides of the main photosensitive region P110. Specifically, as shown in FIG. 6, the first auxiliary photosensitive regions S121 and the second auxiliary photosensitive regions S122 are alternately arranged at the periphery of the main photosensitive region P110. Optionally, the first auxiliary photosensitive region S121 and the second auxiliary photosensitive region S122 are arranged at the periphery of two adjacent sides or three sides of the regular hexagon.

Figure 7:
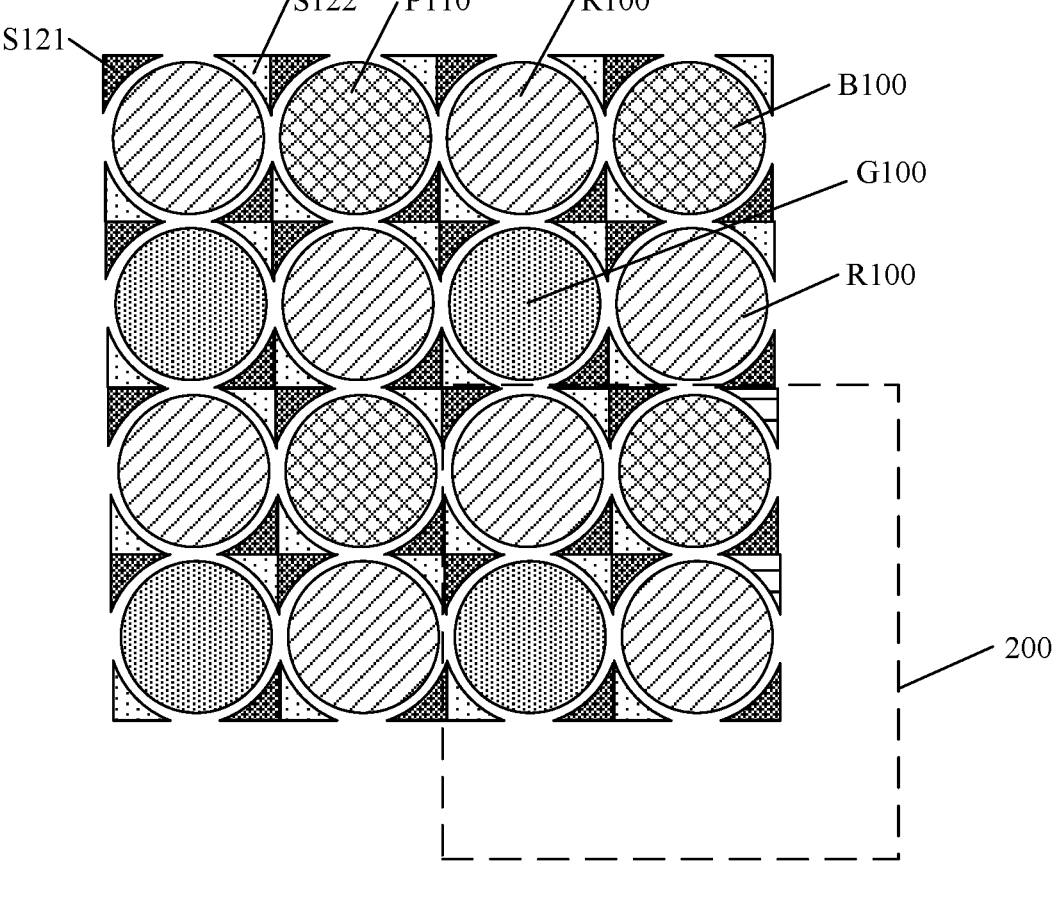
FIG. 7 is a structural schematic diagram of an image sensor according to yet still another exemplary embodiment of the present disclosure.

Optionally, FIG. 7 is a structural schematic diagram of an image sensor provided by yet still another exemplary embodiment of the present disclosure. As shown in FIG. 7, in each photosensitive unit 100 provided by the embodiment of the present disclosure, the shape of the main photosensitive region P110 is circular, and the auxiliary photosensitive region S120 includes two first auxiliary photosensitive regions S121 and two second auxiliary photosensitive regions S122. Specifically, the first auxiliary photosensitive region S121 and the second auxiliary photosensitive region S122 are alternately arranged at the periphery of the main photosensitive region P110. Specifically, the two first auxiliary photosensitive regions S121 are center-symmetrical with the center of the main photosensitive region P110 as the center of symmetry, and the two second auxiliary photosensitive regions S122 are also center-symmetrical with the center of the main photosensitive region P110 as the center of symmetry. The shape of the auxiliary photosensitive region S120 and the relative positional relationship between the auxiliary photosensitive region S120 and the main photosensitive region P110 are not further limited in this embodiment of the present disclosure, as long as the auxiliary photosensitive region S120 can enlarge the wavelength range of the sensible light of the photosensitive unit 100.

Optionally, the shape of the main photosensitive region may also be configured as an ellipse, a polygon, or a shape composed of a curve and a straight line, and the auxiliary photosensitive regions may be arranged according to the peripheral shape of the main photosensitive region.

Figure 8:
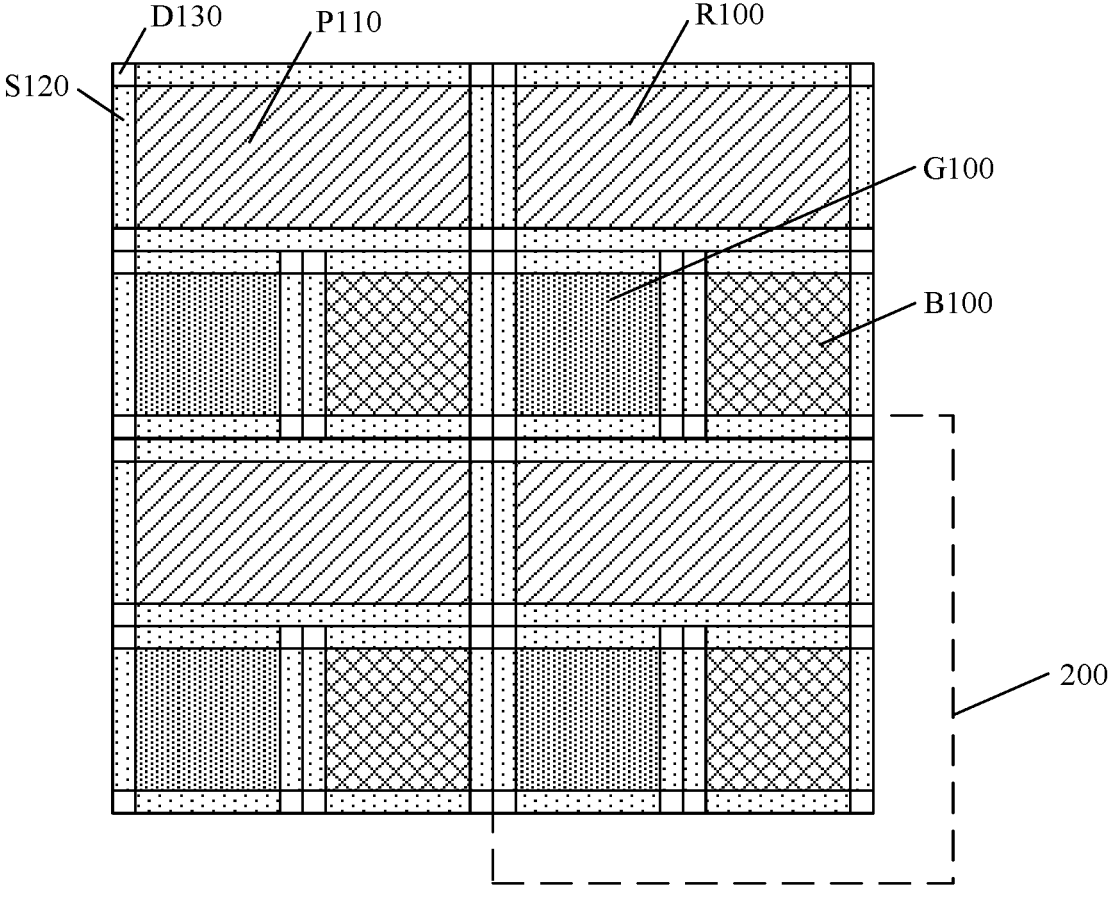
FIG. 8 is a structural schematic diagram of an image sensor according to yet still another exemplary embodiment of the present disclosure.

FIG. 8 is a structural schematic diagram of an image sensor according to yet still another exemplary embodiment of the present disclosure. The embodiment shown in FIG. 8 of the present disclosure is extended on the basis of the embodiment shown in FIG. 2 of the present disclosure. The following focuses on the differences between the embodiment shown in FIG. 8 and the embodiment shown in FIG. 2, and the similarities will not be repeated.

As shown in FIG. 8, the image sensor provided by the embodiment of the present disclosure includes: four pixel groups 200, each the pixel group 200 includes three photosensitive units 100, and the three photosensitive units 100 include a red photosensitive unit R100 and a green photosensitive unit G100 and a blue photosensitive unit B100. Specifically, the shape of the main photosensitive region P110 of the red photosensitive unit R100, the shape of the main photosensitive region P110 of the green photosensitive unit G100, and the shape of the main photosensitive region P110 of the blue photosensitive unit B100 are all rectangles, and the area of the red photosensitive unit R100 is larger than the area of the green photosensitive unit G100, and the area of the red photosensitive unit R100 is also larger than the area of the blue photosensitive unit B100.

Figure 9:
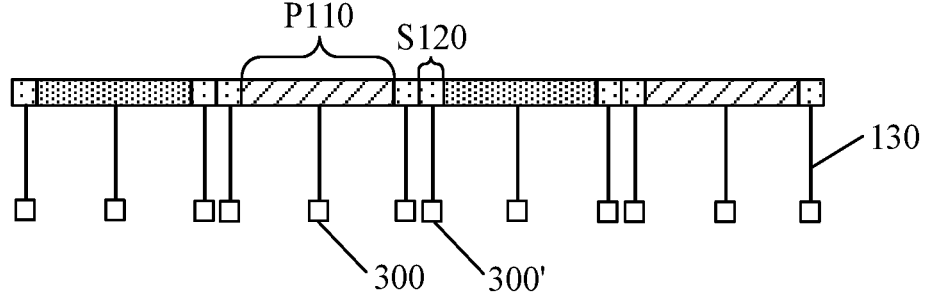
FIG. 9 is a cross-sectional view taken along AA of FIG. 2.

FIG. 9 is a cross-sectional view taken along AA' of FIG. 2. As shown in FIG. 9, the image sensor provided by the embodiment of the present disclosure further includes: a main charge storage part 300 electrically connected to the main photosensitive region P110, and an auxiliary charge storage part 300' electrically connected to the auxiliary photosensitive region S120.

In an embodiment of the present disclosure, each of the plurality of auxiliary photosensitive regions S120 corresponds to a separate auxiliary charge storage part 300'. Further, in a photosensitive unit 100, the main charge storage part 300 and the plurality of auxiliary charge storage parts 300' are electrically insulated from each other.

It should be noted that, as shown in FIG. 9, the main charge storage part 300 is used to store the charges generated by the sensible light at the main photosensitive region P110, and the auxiliary charge storage part 300' is used to store the charges generated by the sensible light at the auxiliary photosensitive region S120. The electrode-wires 130 arranged at the electrode-wire connection region D130 are used to transfer the charges generated by the sensible light at the main photosensitive region P110 and the auxiliary photosensitive region S120 to the main charge storage part 300 and the auxiliary charge storage part 300' respectively. The charge stored in the main charge storage part 300 and the charge stored in the auxiliary charge storage part 300' are used to be read, converted into light signals, and generate images having a high dynamic range, so that people can experience a visual effect close to the real environment. It should be noted that, FIG. 9 does not show the electrode-wire connection region D130, and the electrode-wire 130 is only shown as a straight line, and does not represent the wiring path of the electrode-wire in an actual situation.

Figure 10:
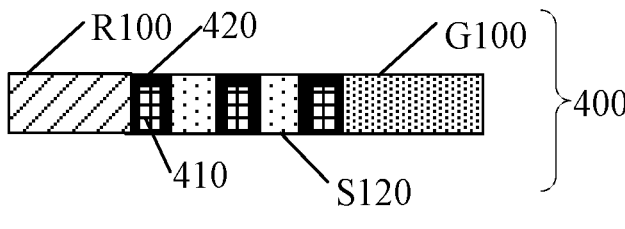
FIG. 10 is a partial enlarged structural schematic diagram of an isolation part provided by an exemplary embodiment of the present disclosure.

FIG. 10 is a schematic partial enlarged structural diagram of an isolation part provided by an exemplary embodiment of the present disclosure. As shown in FIG. 10, the image sensor provided by the embodiment of the present disclosure further includes: an isolation part 400 arranged between the main photosensitive region P110 and the auxiliary photosensitive region S120, the isolation part 400 includes a metal member 410 and a transparent insulating layer 420 provided on the outer surface of the metal member 410.

In an embodiment of the present disclosure, as shown in FIG. 10, which is a cross-sectional view taken along BB' in FIG. 2, an isolation part 400 is provided between adjacent photosensitive units 100, and the isolation part 400 is also arranged between the main photosensitive unit P100 and the auxiliary photosensitive region S120 of each photosensitive unit 100. The isolation part 400 is used to electrically insulate the adjacent photosensitive units 100 from each other, and is also used to electrically insulate the main photosensitive region P110 and the auxiliary photosensitive region of each the photosensitive unit 100.

In an embodiment of the present disclosure, the metal member 410 includes a metal grid, which can reflect light which obliquely projects to the photosensitive unit 100 to the photosensitive unit 100 and isolate light between adjacent photosensitive units 100 to prevent crosstalk. It should be noted that the transparent insulating layer 420 is used to electrically insulate the metal grid and the photosensitive unit 100 from each other, and also to electrically insulate the main photosensitive region P110 and the auxiliary photosensitive region S120 of each photosensitive unit 100 from each other.

It should be noted that the isolation parts are not shown in FIG. 1 to FIG. 9 of the present disclosure.

Figure 11:
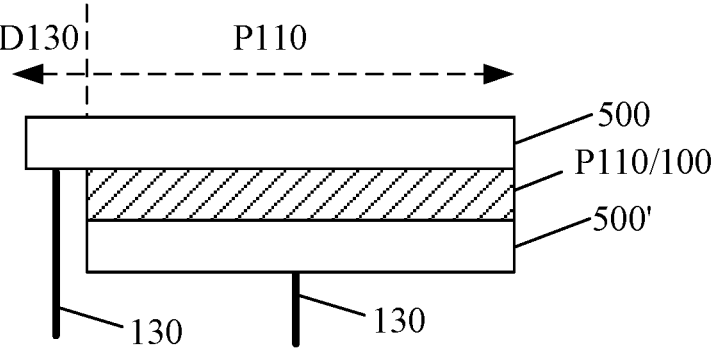
FIG. 11 is a partial structural schematic diagram of an image sensor provided by an exemplary embodiment of the present disclosure.

FIG. 11 is a schematic partial structural diagram of an image sensor provided by an exemplary embodiment of the present disclosure. As shown in FIG. 11, the image sensor provided by the embodiment of the present disclosure further includes: a first semiconductor layer 500 and a second semiconductor layer 500', the first semiconductor layer 500, the photosensitive unit 100 and the second semiconductor layer 500' being stacked in sequence.

It should be noted that, as shown in FIG. 11, which is a cross-sectional view taken along CC' in FIG. 2, when the photosensitive unit 100 is the main photosensitive region P110, the first semiconductor layer 500 and the second semiconductor layer 500' are used to form a potential difference, the charges generated in the main photosensitive region P110 are transferred to the main charge storage part 300. Optionally, when the photosensitive unit 100 is the auxiliary photosensitive region S120, the first semiconductor layer 500 and the second semiconductor layer 500' are used to form a potential difference, and the charges generated in the auxiliary photosensitive region S120 are transferred to the auxiliary charge storage part 300' (not shown). Optionally, the first semiconductor layer 500 includes a P-type semiconductor, and the second semiconductor layer 500' includes an N-type semiconductor. Optionally, the first semiconductor layer 500 includes an N-type semiconductor, and the second semiconductor layer 500' includes a P-type semiconductor. The embodiment of the present disclosure does not further limit the first semiconductor layer 500 and the second semiconductor layer 500', as long as the charges generated by the photosensitive unit 100 can be transferred to the main charge storage part 300 and the auxiliary charge storage part 300'.

Optionally, in a photosensitive unit 100, the first semiconductor layer of the main photosensitive region is electrically connected to the first semiconductor layer of the auxiliary photosensitive region to achieve a common potential. Optionally, between at least two photosensitive units 100, the first semiconductor layers in the photosensitive regions are all electrically connected to achieve a common potential.

In an embodiment of the present disclosure, the photosensitive material of the photosensitive unit 100 includes indium gallium nitride (InGaN), and the photosensitive unit 100 includes a single quantum well or multiple quantum well structure arranged in layers. For example, in a visible light sensor, the photosensitive region is composed of single quantum well or multiple quantum well structure arranged by InGaN and GaN in stack. In this way, the thickness of the photosensitive unit 100 can be as thin as 600 nanometers, which is beneficial to the miniaturization development of the image sensor.

The basic principles of the present disclosure have been described above in conjunction with specific embodiments. However, it should be pointed out that the benefits, advantages, effects, etc. mentioned in the present disclosure are only examples rather than limitations, and these benefits, advantages, effects, etc., are not considered to be required for each embodiment of this disclosure. In addition, the specific details disclosed above are only for the purpose of example and easy understanding, rather than limiting, and the above-mentioned details do not limit the disclosure to be implemented by using the above-mentioned specific details.

The block diagrams of devices, apparatus, equipment, and systems referred to in this disclosure are merely illustrative examples and are not intended to require or imply that the connections, arrangements, or configurations must be in the manner shown in the block diagrams. As those skilled in the art will appreciate, these means, apparatuses, equipment, systems may be connected, arranged, configured in any manner. Words such as "including", "comprising", "having" and the like are open-ended words meaning "including but not limited to" and are used interchangeably therewith. As used herein, the words "or" and "and" refer to and are used interchangeably with the word "and/or" unless the context clearly dictates otherwise. As used herein, the word "such as" refers to and is used interchangeably with the phrase "such as but not limited to".

It should also be pointed out that in the apparatus, equipment and method of the present disclosure, each component or each step can be decomposed and/or recombined. These disaggregations and/or recombinations should be considered as equivalents of the present disclosure.

The above description of the disclosed aspects is provided to enable any person skilled in the art to make or use this disclosure. Various modifications to these aspects will be readily apparent to those skilled in the art, and the generic principles defined herein may be applied to other aspects without departing from the scope of the disclosure. Therefore, this disclosure is not intended to be limited to the aspects shown herein but is to be accorded the widest scope consistent with the principles and novel features disclosed herein.

The foregoing description has been presented for the purposes of illustration and description. Furthermore, this description is not intended to limit the embodiments of the disclosure to the forms disclosed herein. Although a number of example aspects and embodiments have been discussed above, those skilled in the art will recognize certain variations, modifications, changes, additions and sub-combinations thereof.

What is claimed is:

1. An image sensor, comprising:
at least one photosensitive unit, wherein the photosensitive unit comprises a main photosensitive region and an auxiliary photosensitive region arranged at a periphery of the main photosensitive region, and a photosensitive component content of the main photosensitive region is different from a photosensitive component content of the auxiliary photosensitive region, enabling a wavelength range of sensible light corresponding to the main photosensitive region to be different from a wavelength range of sensible light corresponding to the auxiliary photosensitive region, wherein the main photosensitive region and the auxiliary photosensitive region are sensitive to the same color of light;
wherein both the main photosensitive region and the auxiliary photosensitive region comprise a photosensitive component, the auxiliary photosensitive region comprises at least one first auxiliary photosensitive region and at least one second auxiliary photosensitive region, both the first auxiliary photosensitive region and the second auxiliary photosensitive region comprise the photosensitive component, and a photosensitive component content of the first auxiliary photosensitive region is different from a photosensitive component content of the second auxiliary photosensitive region.

2. The image sensor according to claim 1, wherein the photosensitive component content of the main photosensitive region is higher than the photosensitive component content of the first auxiliary photosensitive region, and is lower than the photosensitive component content of the second auxiliary photosensitive region.

3. The image sensor according to claim 1, wherein a plurality of the first auxiliary photosensitive regions and a plurality of the second auxiliary photosensitive regions are alternately arranged at the periphery of the main photosensitive region.

4. The image sensor according to claim 1, wherein the photosensitive component of the photosensitive unit comprises an indium-containing GaN-based compound, and an indium component content of the main photosensitive region is different from an indium component content of the auxiliary photosensitive region.

5. The image sensor according to claim 4, wherein, in the photosensitive unit, a difference between the indium component content of the main photosensitive region and the indium component content of the auxiliary photosensitive region is less than or equal to 4%.

6. The image sensor according to claim 1, further comprising: a plurality of pixel groups, wherein each of the pixel groups comprises at least three the photosensitive units, comprising a red photosensitive unit, a green photosensitive unit, and a blue photosensitive unit, and a photosensitive component content of a main photosensitive region of the red photosensitive unit, a photosensitive component content of a main photosensitive region of the green photosensitive unit, and a photosensitive component content of a main photosensitive region of the blue photosensitive unit are different.

7. The image sensor according to claim 6, wherein an area of the red photosensitive unit is larger than an area of the green photosensitive unit, and/or the area of the red photosensitive unit is larger than an area of the blue photosensitive unit.

8. The image sensor according to claim 6, wherein the pixel group further comprises an infrared photosensitive unit, and a photosensitive component content of a main photosensitive region of the infrared photosensitive unit is higher than the photosensitive component content of the main photosensitive region of the red photosensitive unit.

9. The image sensor according to claim 1, further comprising:
a main charge storage part electrically connected to the main photosensitive region, and an auxiliary charge storage part electrically connected to the auxiliary photosensitive region, wherein the main charge storage part and the auxiliary charge storage part are electrically insulated from each other.

10. The image sensor according to claim 1, further comprising:
an isolation part arranged between the main photosensitive region and the auxiliary photosensitive region, wherein the isolation part comprises a metal member and a transparent insulation layer arranged on an outer surface of the metal member, and the isolation part is used for electrically insulating the main photosensitive region from the auxiliary photosensitive region.

11. The image sensor according to claim 10, wherein the metal member comprises a metal grid, used for reflecting light which obliquely projects to the photosensitive unit to the photosensitive unit again and isolating light between adjacent photosensitive units.

12. The image sensor according to claim 1, wherein the photosensitive unit further comprises an electrode-wire connection region, used for arranging electrode wires.

13. The image sensor according to claim 1, wherein a photosensitive component of the photosensitive unit comprises an aluminum-containing GaN based compound, and an aluminum component content of the main photosensitive region is different from the aluminum component content of the auxiliary photosensitive region.

14. The image sensor according to claim 1, wherein a photosensitive material of the photosensitive unit comprises indium gallium nitride.

15. The image sensor according to claim 1, wherein the photosensitive unit comprises a single-quantum-well structure or a multiple-quantum-well structure arranged in layers.

* * * * *